United States Patent
Tanaka et al.

(10) Patent No.: US 7,838,114 B2
(45) Date of Patent: Nov. 23, 2010

(54) THERMOSETTING RESIN COMPOSITION AND USE THEREOF

(75) Inventors: Shigeru Tanaka, Settsu (JP); Kanji Shimoosako, Settsu (JP); Takashi Ito, Otsu (JP); Mutsuaki Murakami, Settsu (JP)

(73) Assignee: Kaneka Corporation, Osaka (JP)

( * ) Notice: Subject to any disclaimer, the term of this patent is extended or adjusted under 35 U.S.C. 154(b) by 780 days.

(21) Appl. No.: 10/588,264

(22) PCT Filed: Feb. 22, 2005

(86) PCT No.: PCT/JP2005/002781

§ 371 (c)(1),
(2), (4) Date: Aug. 3, 2006

(87) PCT Pub. No.: WO2005/080466

PCT Pub. Date: Sep. 1, 2005

(65) Prior Publication Data

US 2008/0230261 A1    Sep. 25, 2008

(30) Foreign Application Priority Data

Feb. 25, 2004 (JP) .................. 2004-049388

(51) Int. Cl.
C08G 59/50 (2006.01)
C08L 79/08 (2006.01)
C09J 163/00 (2006.01)

(52) U.S. Cl. ............... 428/413; 428/473.5; 525/423; 525/436

(58) Field of Classification Search ........... 525/423, 525/436; 428/413, 473.5
See application file for complete search history.

(56) References Cited

FOREIGN PATENT DOCUMENTS

| EP | 1281727 A1 | 2/2003 |
|---|---|---|
| JP | 2-147235 A | 6/1990 |
| JP | 2000-109645 A | 4/2000 |
| JP | 2001-329246 A | 11/2001 |
| JP | 2001-348556 A | 12/2001 |
| JP | 2002-047472 A | 2/2002 |
| JP | 2004-315754 A | 11/2004 |

OTHER PUBLICATIONS

English language computer translation of JP 2001-348556, published Dec. 18, 2001, Kanegafuchi Chemical Ind.

*Primary Examiner*—Ana L Woodward
(74) *Attorney, Agent, or Firm*—Sughrue Mion, PLLC

(57) ABSTRACT

A thermosetting resin composition contains a polyimide resin component (A) containing at least one polyimide resin, an amine component (B) containing at least one amine, an epoxy resin component (C) containing at least one epoxy resin, and an imidazole component (D) containing at least one imidazole.

9 Claims, No Drawings

THERMOSETTING RESIN COMPOSITION AND USE THEREOF

BACKGROUND OF THE INVENTION

1. Field of the Invention

The present invention relates to thermosetting resin compositions and use thereof. In particular, it relates to a thermosetting resin composition which contains a polyimide resin component, an amine component, an epoxy resin component, and an imidazole component as essential components and which is suitable for making circuit boards such as flexible printed circuits and build-up circuit boards, and representative uses of such a composition, such as laminates and circuit boards incorporating the composition.

2. Description of the Related Art

In recent years, in order to increase the data processing ability of electronic devices, the frequency of electric signals transmitted through circuits of wiring boards incorporated in electronic devices has been increasing. Thus, it is desirable to ensure electrical reliability of wiring (circuit) boards and to suppress a decrease in speed of transmission of electric signals and loss of electric signals in circuits that use higher-frequency electric signals.

On the circuit boards described above, insulating layers, such as a protective film for protecting the wiring board and the circuit and an interlayer insulating film for insulating between layers of a multilayered wiring board, are usually formed. Since the insulating layers such as the protective film and the interlayer insulating film are formed on the wiring board, these films are required to exhibit both insulating properties and adhesiveness to the wiring board.

In particular, when flexible printed circuits (FPCs) or build-up circuit boards are stacked to form a multilayer wiring board, the interlayer insulating films bond and fix the substrates to one another and also fix the circuit wirings since the material of the interlayer insulating films fills the gaps between the circuit wirings. Thus, the interlayer insulating films must have both excellent adhesiveness to substrates and a certain degree of flowability that can fill the gaps between the wirings of the circuit wiring. Thus, the insulating layers such as protective film and the interlayer insulating film described above are prepared by an adhesive material having adhesiveness and resin flowability.

When the above-described adhesive material is used to form insulating layers, the adhesive material preferably has, at the least, (1) properties that can impart high reliability to wiring boards in a GHz band and (2) properties that do not adversely affect the transmission of electric signals. In this manner, the data processing ability of the electronic devices can be increased by using higher-frequency electric signals.

Typical examples of known adhesive materials used in wiring boards are epoxy adhesive materials and thermoplastic polyimide adhesive materials. The epoxy adhesive materials have excellent processability, i.e., ability to bond workpieces at low temperature and low pressure and ability to fill gaps between lines of circuit wiring, and exhibit remarkable adhesiveness to workpieces. The thermoplastic polyimide adhesive materials exhibit superior heat resistance, such as low thermal expansion and high thermal decomposition temperature.

Japanese Unexamined Patent Application Publication No. 8-27430 discloses a technique that uses a film adhesive prepared by mixing a polyimide resin having a glass transition temperature in a particular range, an epoxy compound, and a compound having active hydrogen groups reactive to the epoxy compound. The film adhesive prepared by this technique is disclosed to have capacity to bond workpieces to each other at low temperature in a short time and capacity to yield reliable heat resistance at high temperature.

However, the above-described known adhesive materials do not have properties sufficient for making wiring boards suitable for higher-frequency electric signals.

To be more specific, typical epoxy adhesive materials exhibit high dielectric constant in a GHz band and high dielectric tangent after they are cured into epoxy resins. Thus, their dielectric characteristics are not satisfactory. In contrast, the thermoplastic polyimide adhesive materials exhibit low dielectric constant in a GHz band and low dielectric tangent and thus have good dielectric characteristics.

However, high temperature and high pressure are necessary to bond workpieces onto each other using thermoplastic polyimide adhesive materials. Thus, the thermoplastic polyimide adhesive materials do not have sufficient processability.

The film adhesive disclosed in Japanese Unexamined Patent Application Publication No. 8-27430 is a mixture of a polyimide resin and an epoxy compound, is capable of bonding at low temperature in a shot time, and has reliable heat resistance at high temperature. However, the specification is silent as to its ability to fill the gaps (resin flowability) in wiring circuits and its dielectric characteristics. The epoxy compound contained in this film adhesive increases low-temperature processability by decreasing the softening temperature of the film adhesive. However, the epoxy compound increases the dielectric constant and the dielectric tangent if the content thereof is large. Thus, the film adhesive disclosed in Japanese Unexamined Patent Application Publication No. 8-27430 does not achieve sufficient dielectric characteristics.

In order to increase the data processing ability of electronic devices by increasing the frequency of electric signals, the insulating layers must have sufficient adhesiveness (i), processability and handleability (ii), heat resistance (iii), and resin flowability (iv). In addition, the insulating layers are required to exhibit good dielectric characteristics (v), i.e., low dielectric constant and low dielectric tangent, in the GHz band after curing of the resin. Thus, development of an adhesive material that can produce an insulating layer that satisfies the characteristics (i) to (v) above is awaited.

SUMMARY OF THE INVENTION

An object of the present invention is to provide a thermosetting resin composition suitable for the production of circuit boards, such as flexible printed circuits and build-up circuit boards and having excellent adhesiveness, processability, heat resistance, resin flowability, and dielectric characteristics in a GHz band. Representative usage of the thermosetting resin is also provided.

The present inventors have conducted thorough investigations and found that an adhesive material and an insulating layer that contain a polyimide resin, a diamine, an epoxy resin, and imidazole as essential components exhibit excellent adhesiveness to a workpiece such as a circuit board (i), processability and handleability that enable low temperature bonding (ii), and heat resistance in terms of thermal expansion and thermal decomposition (iii). Moreover, in these adhesive materials and the insulating layer, flowability of the resin (iv) necessary for embedding a circuit can be specifically increased, and dielectric characteristics (v) can be improved since the cured resin has low dielectric constant and dielectric tangent in the GHz band. The present invention has been made based on these findings.

A first aspect of the invention provides a thermosetting resin composition containing a polyimide resin component (A) containing at least one polyimide resin, an amine component (B) containing at least one amine, an epoxy resin component (C) containing at least one epoxy resin, and an imidazole component (D) containing at least one imidazole.

Preferably, the mass ratio of the content of the polyimide resin component (A) to the total content of the amine component (B) and the epoxy resin component (C), i.e., (A)/[(B)+(C)], is in the range of 0.4 to 2.0.

Preferably, the epoxy resin component (C) contains a crystalline epoxy resin. The melting point of the crystalline epoxy resin is preferably in the range of 60° C. to 220° C.

Preferably, the thermosetting resin composition is in a semi-cured state and has a minimum melt viscosity in the range of 100 poise to 50,000 poise in the temperature range of 60° C. to 200° C.

Preferably, the molar ratio of the number of moles of active hydrogen contained in the amine component (B) to the number of moles of epoxy groups in the epoxy resin contained in the epoxy resin component (C), i.e., (B)/(C), is in the range of 0.4 to 2.0.

Preferably, the amine component (B) contains an aromatic diamine having a molecular weight of 300 or more. Moreover, the at least one polyimide resin contained in the polyimide resin component (A) is preferably prepared by reacting a diamine component (A-2) containing at least one diamine and an acid dianhydride component (A-1) containing at least one acid dianhydride having a structure represented by general formula (1):

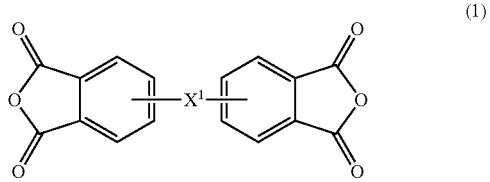

(wherein $X^1$ represents a divalent group selected from the group consisting of —O—, —CO—, —O—$X^2$—O—, and —COO—$X^2$—OCO—, wherein $X^2$ represents a divalent organic group). Preferably, $X^2$ is a $C_2$-$C_{10}$ aliphatic group or a group having at least one aromatic ring. More preferably, $X^2$ is a group having at least one aromatic ring.

A second aspect of the present invention provides a laminate including at least one resin layer composed of the thermosetting resin composition described above. A third aspect of the present invention provides a circuit board composed of the thermosetting resin composition described above.

As is described above, the thermosetting resin composition of the present invention contains the polyimide resin component (A), the amine component (B), the epoxy resin component (C), and the imidazole component (D) as essential components.

Thus, the thermosetting resin composition exhibits excellent adhesiveness to workpieces such as circuit boards (i), processability and handleability that enable bonding at low temperature (ii), heat resistance in terms of thermal expansion and thermal decomposition (iii), and flowability of the resin necessary for embedding a circuit (iv). A cured resin prepared by curing this thermosetting resin composition can exhibit significantly lower dielectric constant and dielectric tangent in the GHz band compared to that of known resin composition containing a polyimide resin and an epoxy resin. Thus, a thermosetting resin composition having excellent dielectric characteristics (v) can be provided.

Compared to known resin compositions, the thermosetting resin composition of the present invention can achieve a good balance among various good characteristics such as dielectric characteristics, flowability, heat resistance, adhesiveness, and processability. Since the dielectric characteristics are excellent, the thermosetting resin composition can be applied to manufacture of flexible printed circuits, build-up circuit boards, and laminates that require low dielectric constant and low dielectric tangent in the GHz band.

Thus, the present invention can be used in basic materials industries, such as resin composition and adhesive industries, various chemical industries, and various electronic components industries.

DESCRIPTION OF THE PREFERRED EMBODIMENTS

The present invention will now be described by way of embodiments. The embodiments below do not limit the scope of the present invention.

In the embodiment, outline of the inventive thermosetting resin composition, individual components of the inventive thermosetting resin composition, and the usage of the inventive thermosetting resin composition are presented in that order to describe the invention in detail.

(I) Inventive Thermosetting Resin Composition

The inventive thermosetting resin composition contains at least four essential components: (A) a polyimide resin component, (B) an amine component, (C) an epoxy resin component, and (D) an imidazole component. In this manner, the thermosetting resin composition and a cured resin prepared by curing this composition exhibit satisfactory adhesiveness (i), processability and handleability (ii), heat resistance (iii), resin flowability (iv), and dielectric characteristics (v), and a satisfactory balance among these characteristics. The thermosetting resin composition containing these components has excellent adhesive characteristics, and can be cured to form insulating layers having excellent properties. In the present invention, "good dielectric characteristics" refer to low dielectric constant and low dielectric tangent in the GHz band.

<Feature 1 of Thermosetting Resin Composition: The Mixing Ratio for the Components (A) to (C)>

The thermosetting resin composition of the invention contains at least four components: (A) a polyimide resin component, (B) an amine component, (C) an epoxy resin component, and (D) an imidazole component. As described below, the thermosetting resin composition may contain (E) an additional component. Each of the essential components (A) to (D) above needs to contain at least one substance classified as such a component. The mixing ratio for the components (A) to (C) should be controlled in a particular range so that the thermosetting resin composition and the cured resin achieve sufficient adhesiveness (i), processability and handleability (ii), heat resistance (iii), resin flowability (iv), and dielectric characteristics (v), and a good balance among these characteristics.

The mixing ratio of the components (A) to (C) above is defined in terms of a mass ratio or weight ratio. In the thermosetting resin composition of the invention, the mixing ratio of the mass (weight) of the polyimide resin component (A) to the total mass (weight) of the (B) amine component and (C) epoxy resin component, i.e., the ratio (A)/[(B)+(C)], is controlled in a particular range.

In detail, the lower limit of the mass ratio (A)/[(B)+(C)] should be 0.4 or more and preferably 0.5 or more. The upper limit of the ratio (A)/[(B)+(C)] should be 2.0 or less and preferably 1.5 or less. In short, the ratio (A)/[(B)+(C)] is preferably in the range of 0.4 to 2.0.

At a mass ratio less than 0.4, i.e., when the total content of the amine component (B) and the epoxy resin component (C) is increased relative to the content of the polyimide resin component (A) in the thermosetting resin composition, heat resistance (iii) of the cured resin sheet in terms of elasticity modulus and linear expansion coefficient at high temperature and resin flowability (iv) are improved. However, good dielectric characteristics (v) may not always be achieved. Thus, the mixing ratio is preferably at least 0.4 for applications in which dielectric characteristics are important. At a mixing ratio of less than 0.4, the resulting cured resin sheet may not achieve low dielectric constant and low dielectric tangent (good dielectric characteristics) in the GHz band.

The term "good dielectric characteristics" will now be described in detail. The above-described thermosetting resin composition can be cured by heating at 150° C. to 250° C. for 1 to 5 hours. The cured resin is considered to have "good dielectric characteristics" when the cured resin exhibits low dielectric constant and low dielectric tangent at a frequency of 1 to 10 GHz. The dielectric constant is preferably 3.3 or less, and the dielectric tangent is preferably 0.020 or less. When the thermosetting resin composition having a dielectric constant and a dielectric tangent within these ranges is applied to a protective material or an interlayer insulating material for circuit boards, electrical insulation of the circuit boards can be ensured and a decrease in speed of signal transmission and loss of signals in the circuits on the circuit boards can be suppressed. Thus, highly reliable circuit boards can be obtained.

In contrast, when the mixing ratio exceeds 2.0, i.e., when the content of the polyimide resin component (A) is increased relative to the total content of the amine component (B) and the epoxy resin component (C), good dielectric characteristics (v) can be achieved. However, the composition may not always have sufficient adhesiveness (i), processability and handleability (ii), and resin flowability (iv). Thus, the mixing ratio is preferably 2.0 or less on a mass basis for applications that particularly require adhesiveness (i), processability and handleability (ii), and resin flowability (iv). In other words, at a mass mixing ratio exceeding 2.0, the resulting cured resin can exhibit good dielectric characteristics in the GHz band. However, the thermosetting resin composition before curing may not have sufficient adhesiveness to conductors and circuit boards and may not have sufficient processability during bonding of the thermosetting resin composition, the conductors, and the circuit boards. Moreover, the resin may not have sufficient ability to fill the circuit due to decreased resin flowability.

<Feature 2 of the Thermosetting Resin Composition: The Mixing Ratio of (B) and (C)>

More preferably, in the thermosetting resin composition of the present invention, the ratio of the component (B) to the component (C) is controlled. The mixing ratio of these two components is defined in terms of moles.

Preferably, the molar ratio (B)/(C) of these two components is in a particular range, wherein (C) is the number of moles of epoxy groups of the epoxy resin contained in the epoxy resin component (C) and (B) is the number of moles of active hydrogen contained in the amine component (B).

In detail, the lower limit of the molar mixing ratio (B)/(C) is 0.4 or more and preferably 0.7 or more. The upper limit of the molar mixing ratio (B)/(C) is preferably 2.0 or less and more preferably 1.1 or less. Thus, the preferable range of the molar mixing ratio is 0.4 to 2.0.

At a molar mixing ratio of less than 0.4 or exceeding 2.0, the dielectric characteristics (v) of the cured resin may be insufficient. Moreover, the thermosetting resin composition before curing exhibits decreased glass transition temperature, thermal expansion coefficient, and elasticity modulus at high temperature and thus has lower heat resistance (iii).

The numbers of moles of the epoxy groups and the active hydrogen are calculated from the epoxy number and the molecular weight of diamine, respectively. In this invention, the term "active hydrogen" refers to a hydrogen atom directly bonded to the nitrogen atom of an amino group. One amino group typically contains two active hydrogen atoms.

The mixing ratio concerning the remaining essential component, i.e., the imidazole component (D), of the thermosetting resin composition will be described below in the subsection, "(II-4) (D) Imidazole component" in the section, "(II) Respective components of the thermosetting resin composition of the invention". The content of the imidazole component (D) is preferably in the range of 0.05 to 10.0 parts by mass per 100 parts by mass of the epoxy resin component (C).

In this invention, as is described above, the mixing ratio of the components (A) to (C) is defined on a mass basis. Preferably, the mixing ratio of the components (B) and (C) is defined on a molar basis. More preferably, the mixing ratio of the component (D) is defined on a mass basis. In this manner, the thermosetting resin composition and the cured resin exhibit adhesiveness (i) to workpieces such as circuit boards and conductors, processability and handleability (ii) that enable bonding at low temperature, heat resistance (iii) in terms of thermal expansion and thermal decomposition, resin flowability (iv) required for filling a circuit, and dielectric characteristics (v) of the cured resin. Furthermore, various other characteristics, such as resistance to humidity testing in a pressure cooker (PCT resistance), soldering heat resistance, and insulation properties, can also be enhanced, and a satisfactory balance among these characteristics can be achieved.

<Characteristics of Thermosetting Resin Composition>

The thermosetting resin composition of the invention contains the components (A) to (D) described above as essential components. The characteristics of the thermosetting resin composition are not particularly limited. However, among the characteristics (i) to (v), the resin flowability (iv) can be adjusted to a more preferable level by defining the lower limit of the melt viscosity (the minimum melt viscosity) under particular conditions. In detail, the thermosetting resin composition in a semi-cured state preferably has a minimum melt viscosity of 100 to 50,000 poise in the temperature range of 60° C. to 200° C.

At a minimum melt viscosity exceeding 50,000 poise under the above-described conditions, the resin flowability (iv) is insufficient, and the ability of the resin to fill the gaps in the circuit may be reduced. At a minimum melt viscosity lower than 100 poise, a large amount of the thermosetting resin composition drifts out of the substrate during processing, and the amount of the resin remaining on the substrate decreases. As a result, the circuit may not be appropriately embedded.

In the present invention, by defining the mixing ratios of the components, various characteristics such as the adhesiveness of the thermosetting resin composition to a workpiece such as a conductor or a circuit board (i), processability and handleability of the thermosetting resin composition in bonding a conductor or a circuit board (ii), and low thermal expansion coefficient and high thermal decomposition temperature (iii), can be improved. In addition, the resin flowability (iv) and the dielectric properties (v) can be enhanced. Since the thermosetting resin composition and the cured resin achieve a good balance between these characteristics, the present invention is suitable for production of circuit boards, such as flexible printed circuits and build-up circuit boards. The circuit board made from the inventive thermosetting resin composition exhibits satisfactory characteristics.

(II) Respective Components of the Thermosetting Resin Composition of the Invention The components (A) to (D) used in the present invention and the additional component (E) will now be described in detail.

(II-1) Polyimide Resin Component (A)

The polyimide resin component (A) used in the invention should contain at least one polyimide resin. The thermosetting resin composition of the invention containing the polyimide resin component (A) exhibits sufficient heat resistance. Moreover, the cured resin exhibits sufficient flexibility, high mechanical properties, chemical resistance, and good dielectric characteristics.

The polyimide resin contained in the polyimide resin component (A) of the invention is not particularly limited but preferably a soluble polyimide resin soluble in an organic solvent. The term "soluble polyimide resin" refers to a polyimide resin that can be dissolved in an organic solvent in a concentration of 1 wt % or more in the temperature range of 15° C. to 100° C. The organic solvent may be at least one selected from ether solvents such as dioxane, dioxolane, and tetrahydrofuran; acetamide solvents such as and N,N-diethylacetamide and N,N-dimethylacetamide; formamide solvents such as N,N-diethylformamide and N,N-dimethylformamide; and pyrrolidone solvents such as N-methyl-2-pyrrolidone and N-vinyl-2-pyrrolidone. These solvents may be used alone or in combination at a desired ratio.

The thermosetting resin composition containing a soluble polyimide resin does not require high temperature, long processing to cure. Thus, the epoxy resin component (C) described below can be efficiently cured. In other words, in the present invention, a soluble polyimide resin is preferably contained in the polyimide resin component (A) to increase the processability and handleability (ii).

The above-described polyimide resin can be manufactured by any known technique. For example, the polyimide resin can be obtained by chemical or thermal imidization of a polyamic acid, which is a precursor of the polyimide resin. The process of producing a polyimide resin by imidization of a polyamic acid is described in detail below.

<Production (Synthesis) of Polyamic Acid>

The polyamic acid may be synthesized by reacting an acid dianhydride component (A-1) containing at least one acid dianhydride with a diamine component (A-2) containing at least one diamine in an organic solvent. In the reaction system, the total content of the acid dianhydride component (A-1) and the total content of the diamine component (A-2) are adjusted to be substantially equimolar. Thus, when two or more compounds are contained in each of the acid dianhydride component (A-1) and the diamine component (A-2), the total moles of the diamines and the total moles of the acid dianhydrides are adjusted to be substantially equal to each other to yield a polyamic acid copolymer.

Note that the diamine component (A-2) is a monomeric raw material for synthesizing polyamic acid, which is a precursor of the polyimide resin. The diamine component (A-2) is a different component from the amine component (B), which is the essential component of the inventive thermosetting resin composition. For purposes of explanation, the monomeric raw materials of the polyamic acid are referred to as "monomeric acid dianhydride component (A-1)" and "monomeric diamine component (A-2)" to distinguish them from the essential components, such as the amine component (B), of the thermosetting resin composition.

The technique of reacting the monomeric acid dianhydride component (A-1) with the monomeric diamine component (A-2) is not particularly limited. A representative example of such a technique is a process of dissolving the monomeric diamine component (A-2) in an organic solvent and adding the monomeric acid dianhydride component (A-1) to the resulting solution to yield a solution of a polyamic acid dissolved in an organic solvent (hereinafter referred to as "polyamic acid solution"). Here, the term "dissolve" refers to a state in which a solute is completely dissolved in a solvent and a state in which a solute is homogeneously dispersed or diffused in a solvent and which can be considered equivalent to a complete dissolution.

The order of adding the monomeric acid dianhydride component (A-1) and the monomeric diamine component (A-2) is not limited to one described above. Persons skilled in the art may adequately modify the process of the addition. For example, the monomeric acid dianhydride component (A-1) may first be dissolved or dispersed in an organic solvent, and then be combined with the monomeric diamine component (A-2). Alternatively, a process of adding an adequate amount of the monomeric diamine component (A-2) to an organic solvent, then adding the monomeric acid dianhydride component (A-1) in excess relative to the total of the monomeric diamine component (A-2) to the resulting mixture, and then adding the monomeric diamine component (A-2) in an amount equivalent to the excess amount of the monomeric acid dianhydride component (A-1) may be employed.

The reaction conditions of the monomeric acid dianhydride component (A-1) and the monomeric diamine component (A-2) are not particularly limited. Any conditions that allow polymerization of the monomer raw materials, i.e., the acid dianhydride and the diamine, may be employed. The reaction temperature is preferably 80° C. or less and more preferably in the range of 0° C. to 50° C. The reaction time may be in the range of 30 minutes to 50 hours. Under the reaction temperature and the reaction time within these ranges, a polyamic acid can be effectively synthesized.

The organic solvent used in the synthesis of the polyamic acid may be any organic polar solvent. It is preferable to use an organic solvent that has a boiling point as low as possible and is a good solvent to polyamic acid. Such an organic solvent can yield two advantages in the process of manufacture: (1) the increase in viscosity of the reaction solution during polymerization (synthesis of polyamic acid) of the monomeric raw materials (A-1) and (A-2) can be minimized and stirring can be facilitated thereby; and (2) the resulting polyimide resin can be easily dried.

Examples of the organic solvent include sulfoxide solvents such as dimethylsulfoxide and diethylsulfoxide; formamide solvents such as N,N-dimethylformamide and N,N-diethylformamide; acetamide solvents such as N,N-dimethylacetamide and N,N-diethylacetamide; pyrrolidone solvents such as N-methyl-2-pyrrolidone and N-vinyl-2-pyrrolidone; phenolic solvents such as phenol, o-cresol, m-cresol, p-cresol, xylenol, phenol halides, and catechol; and hexamethylphosphoramide and γ-butyrolactone. These solvents may be used alone or in combination at a desired ratio. If necessary, an aromatic hydrocarbon, such as xylene or toluene, may be used in combination with the organic solvent.

<Monomeric Acid Dianhydride Component (A-1)>

The monomeric acid dianhydride component (A-1), which is a monomeric raw material used to synthesize the polyamic acid, is not particularly limited. Any known acid dianhydride that can impart suitable characteristics, such as solubility in various organic solvents, heat resistance, and compatibility with other essential components (B) to (D), to the resulting polyimide resin may be used. In particular, an aromatic tetracarboxylic dianhydride is preferable. Preferably, the aromatic tetracarboxylic dianhydride is a compound having a structure represented by general formula (1):

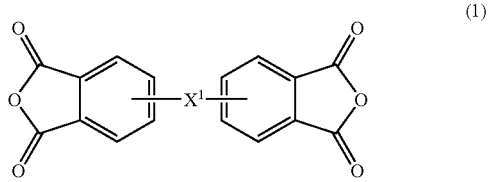
(1)

(wherein $X^1$ represents a divalent group selected from the group consisting of —O—, —CO—, —O—$X^2$—O—, and —COO—$X^2$—OCO—, wherein $X^2$ represents a divalent organic group). Only one type of the acid dianhydride having such a structure may be used; alternatively, two or more of such acid dianhydrides may be used in combination at a desired ratio. Preferably, $X^2$ is a $C_2$-$C_{10}$ aliphatic group or a group having at least one aromatic ring. More preferably, $X^2$ is a group having at least one aromatic ring.

In order to impart good dielectric characteristics and heat resistance to the resulting thermosetting resin composition and cured resin, $X^1$ in the acid dianhydride having a structure represented by general formula (1) (hereinafter referred to as "acid dianhydride represented by formula (1)") is preferably —O—$X^2$—O— or —COO—$X^2$—OCO—.

Here, $X^2$ is preferably a divalent aromatic organic group selected from the group (1-1) below:

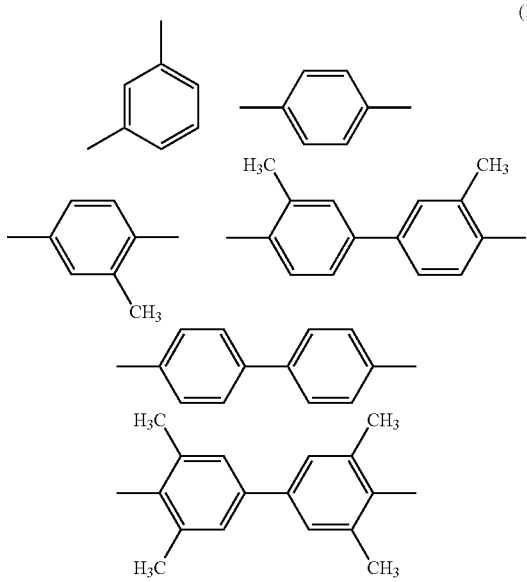
(1-1)

or a divalent aromatic organic group having a structure represented by general formula (1-2) below:

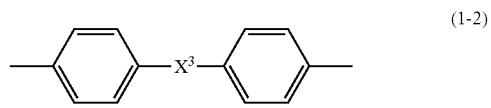
(1-2)

(wherein $X^3$ is a divalent group selected from the group consisting of —$C_pH_{2p}$—, —C(=O)—, —$SO_2$—, —O—, and —S—, and p is an integer of 1 to 5).

Among the aromatic tetracarboxylic dianhydrides described above, it is particularly preferable to use 4,4'-(4,4'-isopropylidenediphenoxy)bisphthalic dianhydride represented by the following formula:

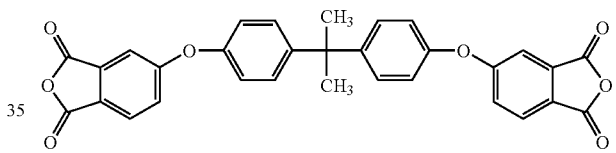

4,4'-(4,4'-Isopropylidenediphenoxy)bisphthalic dianhydride described above can impart sufficient characteristics, such as solubility in various organic solvents, heat resistance, compatibility with the amine component (B) and the epoxy resin component (C), and dielectric characteristics, to the resulting polyamic acid and polyimide resin. Moreover, a satisfactory balance among these characteristics can be achieved.

Furthermore, compared to other compounds that can be used as the monomeric acid dianhydride component (A-1), this substance is easily available.

Two or more types of compounds (acid dianhydrides) may be used as the monomeric acid dianhydride component (A-1). In this invention, an acid dianhydride having the structure represented by general formula (1) above may be used as the monomeric acid dianhydride component (A-1). In detail, the monomeric acid dianhydride component (A-1) should contain at least one acid dianhydride represented by formula (1). If necessary, two or more of such acid dianhydrides may be contained at a desired ratio. Furthermore, an acid dianhydride other than those represented by formula (1) (hereinafter referred to as the "other acid dianhydride") above may be contained.

The content of the acid dianhydride represented by formula (1) in the monomeric acid dianhydride component (A-1), i.e., the ratio of the acid dianhydride represented by formula (1) to the total of the acid dianhydrides, is preferably 50 mol % or more per 100 mol % of all the acid anhydrides. When the content of the acid dianhydride represented by formula (1) is

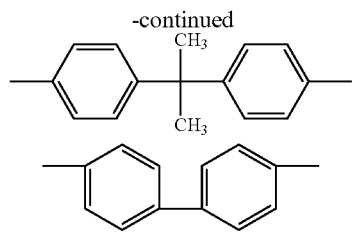

50 mol % or more, the resulting polyamic acid and polyimide resin will exhibit sufficient characteristics, such as solubility in various organic solvents (B), the compatibility with the amine component (B) and the epoxy resin component (C), and dielectric characteristics.

Of the monomeric acid dianhydrides (A-1) described above, the other acid dianhydride is not particularly limited. Aromatic tetracarboxylic dianhydrides having structures other than that represented by formula (1) are preferable. In particular, pyromellitic dianhydride [1,2,4,5-benzenetetracarboxylic dianhydride], 3,3',4,4'-benzophenonetetracarboxylic dianhydride, 3,3',4,4'-diphenylsulfonetetracarboxylic dianhydride, 1,4,5,8-naphthalenetetracarboxylic dianhydride, 2,3,6,7-naphthalenetetracarboxylic dianhydride, 3,3',4,4'-dimethyldiphenylsilane tetracarboxylic dianhydride, 1,2,3,4-furantetracarboxylic dianhydride, 4,4'-bis(3,4-dicarboxyphenoxy) diphenylpropanoic dianhydride, 4,4'-hexafluoroisopropylidenediphthalic anhydride, 3,3',4,4'-biphenyltetracarboxylic dianhydride, 2,3,3',4'-biphenyltetracarboxylic dianhydride, 4,4'-oxydiphthalic anhydride, and p-phenylenediphthalic anhydride. These other acid dianhydrides may be used alone or in combination at a desired ratio.

<Monomeric Diamine Component (A-2)>

The monomeric diamine component (A-2) used as a monomeric raw material for synthesizing the polyamic acid is not particularly limited. Any known diamine that can impart sufficient characteristics, such as solubility in various organic solvents, heat resistance, soldering heat resistance, PCT resistance, low water-absorbing property, and thermoplasticity, to the resulting polyimide resin may be employed. In particular, aromatic diamines are preferable. Preferably, the aromatic diamines are phenylenediamines such as 1,3-phenylenediamine and 1,2-phenylenediamine; and compounds having a structure represented by general formula (2) below:

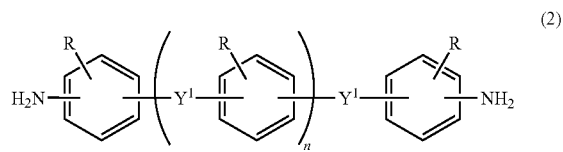

(2)

(wherein $Y^1$s each independently represent a divalent group selected from the group consisting of —C(=O)—, —SO$_2$—, —O—, —S—, —(CH$_2$)$_m$—, —NHCO—, —C(CH$_3$)$_2$—, —C(CF$_3$)$_2$—, and —C(=O)O— or a direct bond; Rs each independently represent a hydrogen atom, a halogen atom, or a $C_1$-$C_4$ alkyl group; and m and n each independently represent an integer of 1 to 5). Compounds having the structure represented by general formula (2) are yet more preferable. The term "direct bond" refers to bonding of two benzene rings by direct bonding of two carbon atoms respectively contained in the two benzene rings.

Examples of the diamine having a structure represented by general formula (2) (hereinafter referred to as "diamine represented by formula (2)" for simplification purposes) include bis[(aminophenoxy)phenyl]alkanes such as bis[4-(3-aminophenoxy)phenyl]methane, bis[4-(4-aminophenoxy)phenyl]methane, 1,1-bis[4-(3-aminophenoxy)phenyl]ethane, 1,1-bis[4-(4-aminophenoxy)phenyl]ethane, 1,2-bis[4-(3-aminophenoxy)phenyl]ethane, 1,2-bis[4-(4-aminophenoxy)phenyl]ethane, 2,2-bis[4-(3-aminophenoxy) phenyl]propane, 2,2-bis[4-(4-aminophenoxy)phenyl]propane, and 2,2-bis[4-(3-aminophenoxy)phenyl]butane; bis[(aminophenoxy) phenyl]fluoroalkanes such as 2,2-bis[3-(3-aminophenoxy) phenyl]-1,1,1,3,3,3-hexafluoropropane and 2,2-bis[4-(4-aminophenoxy)phenyl]-1,1,1,3,3,3-hexafluoropropane; bis (aminophenoxy)benzene compounds such as 1,3-bis(3-aminophenoxy)benzene, 1,4-bis(3-aminophenoxy)benzene, 1,4'-bis (4-aminophenoxy)benzene, and 4,4'-bis(4-aminophenoxy) biphenyl; bis(aminophenoxy)ketone compounds such as bis[4-(3-aminophenoxy)phenyl]ketone and bis[4-(4-aminophenoxy) phenyl]ketone; bis[(aminophenoxy)phenyl]sulfide compounds such as bis[4-(3-aminophenoxy)phenyl]sulfide and bis[4-(4-aminophenoxy)phenyl] sulfide; bis[(aminophenoxy)phenyl]sulfone compounds such as bis[4-(3-aminophenoxy) phenyl]sulfone and bis[4-(4-aminophenoxy) phenyl]sulfone; bis[(aminophenoxy)phenyl] ether compounds such as bis[4-(3-aminophenoxy)phenyl] ether and bis[4-(4-aminophenoxy)phenyl]ether; bis [(aminophenoxy)benzoyl]benzene compounds such as 1,4-bis[4-(3-aminophenoxy)benzoyl]benzene and 1,3-bis[4-(3-aminophenoxy) benzoyl]benzene; bis[(aminophenoxy) benzoyl]diphenyl ether compounds such as 4,4'-bis[3-(4-aminophenoxy)benzoyl]diphenyl ether and 4,4'-bis[3-(3-aminophenoxy)benzoyl]diphenyl ether; benzophenone compounds such as 4,4'-bis[4-(4-amino-α,α-dimethylbenzyl) phenoxy]benzophenone; (phenoxy)phenylsulfone compounds such as 4,4'-bis[4-(4-amino-α,α-dimethylbenzyl) phenoxy]diphenylsulfone and bis[4-{4-(4-aminophenoxy) phenoxy}phenyl]sulfone; and bis[(aminophenoxy)dimethylbenzyl]benzene compounds such as 1,4-bis[4-(4-aminophenoxy)-α,α-dimethylbenzyl]benzene and 1,3-bis[4-(4-aminophenoxy)-α,α-dimethylbenzyl]benzene. These diamines represented by formula (2) may be used alone or in combination at a desired ratio.

Among the diamines represented by formula (2), a diamine having a structure represented by general formula (2-1) below, i.e., a diamine having amino groups in the meta position, is particularly preferable:

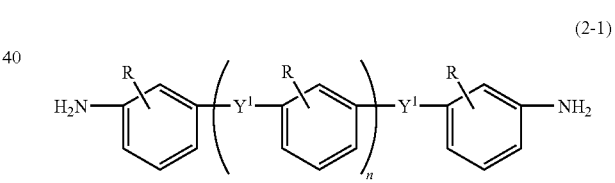

(2-1)

(wherein $Y^1$s each independently represent a divalent group selected from the group consisting of —C(=O)—, —SO$_2$—, —O—, —S—, —(CH$_2$)$_m$—, —NHCO—, —C(CH$_3$)$_2$—, —C(CF$_3$)$_2$—, and —C(=O)O— or a direct bond; Rs each independently represent a hydrogen atom, a halogen atom, or a $C_1$-$C_4$ alkyl group; and m and n each independently represent an integer of 1 to 5). Compared to a diamine having amino groups in the para position, a diamine represented by formula (2) having amino groups in the meta position can impart higher solubility in various organic solvents to the resulting polyimide resin.

Among the examples of the diamines represented by formula (2) described above, examples of the diamine having the structure represented by general formula (2-1) (hereinafter referred to as "meta-position diamine" for simplification purposes) above include 1,1-bis[4-(3-aminophenoxy) phenyl] ethane, 1,2-bis[4-(3-aminophenoxy) phenyl]ethane, 2,2-bis [4-(3-aminophenoxy) phenyl]propane, 2,2-bis[4-(3)-aminophenoxy]phenyl]butane, 2,2-bis[3-(3-aminophenoxy) phenyl]-1,1,1,3,3,3-hexafluoropropane, 1,3-bis (3-aminophenoxy)benzene, 1,4-bis(3-aminophenoxy)benzene, bis

[4-(3-aminophenoxy)phenyl]ketone, bis[4-(3-aminophenoxy) phenyl]sulfide, bis[4-(3-aminophenoxy) phenyl]sulfone, bis[4-(3-aminophenoxy) phenyl]ether, 1,4-bis[4-(3-aminophenoxy) benzoyl]benzene, 1,3-bis[4-(3-aminophenoxy) benzoyl]benzene and 4,4'-bis[3-(3-aminophenoxy) benzoyl]diphenyl ether. These meta-position diamines may be used alone or in combination at a desired ratio.

Among these, 1,3-bis(3-aminophenoxy)benzene is preferably used as the meta-position diamine. By using 1,3-bis (3-aminophenoxy)benzene, a thermosetting resin composition that has good solubility in various organic solvents, soldering heat resistance, and PCT resistance can be produced.

Examples of the diamine contained in the monomeric diamine component (A-2) include diamines having hydroxyl groups (—OH) and/or carboxyl groups (—COOH). For the explanation purposes, this diamine is referred to as "hydroxy diamine" after —OH structurally common. By using the hydroxy diamines, hydroxyl groups and/or carboxyl groups can be introduced to the polyimide resin.

When at least one of a hydroxyl group and a carboxyl group is introduced to the polyimide resin, the curing process of the epoxy resin component (C) in the thermosetting resin composition described below can be accelerated. Thus, in curing the thermosetting resin composition, the epoxy resin component (C) can be thermally cured at low temperature or in a short time. Moreover, since the epoxy resin component (C) reacts with the hydroxyl group and/or carboxyl group, the molecules of the polyimide resin become crosslinked to each other through the epoxy resin. Thus, the resulting cured resin has a reinforced molecular structure.

Thus, by using the hydroxy diamines described above, a polyimide resin containing a hydroxyl and/or carboxyl group can be obtained, and the thermosetting resin composition and the cured resin can exhibit improved characteristics, such as heat resistance, soldering heat resistance, and PCT resistance.

The hydroxy diamine is not particularly limited as long as at least one of a hydroxyl group and a carboxyl group is included in the structure. Examples of the hydroxy diamine include diaminophenol compounds such as 2,4-diaminophenol; diaminobiphenyl compounds such as 3,3'-dihydroxy-4,4'-diaminobiphenyl; hydroxybiphenyl compounds such as 3,3'-diamino-4,4'-dihydroxybiphenyl, 4,4'-diamino-3,3'-dihydroxybiphenyl, 4,4'-diamino-2,2'-dihydroxybiphenyl, and 4,4'-diamino-2,2',5,5'-tetrahydroxybiphenyl; hydroxydiphenylalkanes such as 3,3'-diamino-4,4'-dihydroxydiphenylmethane, 4,4'-diamino-3,3'-dihydroxydiphenylmethane, 4,4'-diamino-2,2'-dihydroxydiphenylmethane, 2,2-bis[3-amino-4-hydroxyphenyl]propane, 2,2-bis[4-amino-3-hydroxyphenyl]propane, 2,2-bis[3-amino-4-hydroxyphenyl] hexafluoropropane, and 4,4'-diamino-2,2',5,5'-tetrahydroxydiphenylmethane; hydroxydiphenyl ether compounds such as 3,3'-diamino-4,4'-dihydroxydiphenyl ether, 4,4'-diamino-3,3'-dihydroxydiphenyl ether, 4,4'-diamino-2,2'-dihydroxydiphenyl ether, and 4,4'-diamino-2,2',5,5'-tetrahydroxydiphenyl ether; diphenylsulfone compounds such as 3,3'-diamino-4,4'-dihydroxydiphenylsulfone, 4,4'-diamino-3,3'-dihydroxydiphenylsulfone, 4,4'-diamino-2,2'-dihydroxydiphenylsulfone, and 4,4'-diamino-2,2',5,5'-tetrahydroxydiphenylsulfone; bis[(hydroxyphenyl)phenyl] alkanes such as 2,2-bis[4-(4-amino-3-hydroxyphenoxy) phenyl]propane; bis(hydroxyphenoxy)biphenyl compounds such as 4,4'-bis(4-amino-3-hydroxyphenoxy)biphenyl; bis [(hydroxyphenoxy)phenyl]sulfone compounds such as 2,2-bis[4-(4-amino-3-hydroxyphenoxy)phenyl]sulfone; diaminobenzoic acids such as 3,5-diaminobenzoic acid; carboxybiphenyl compounds such as 3,3'-diamino-4,4'-dicarboxybiphenyl, 4,4'-diamino-3,3'-dicarboxybiphenyl, 4,4'-diamino-2,2'-dicarboxybiphenyl, and 4,4'-diamino-2,2',5,5'-tetracarboxybiphenyl; carboxydiphenyl alkanes such as carboxydiphenylmethanes, e.g., 3,3'-diamino-4,4'-dicarboxydiphenylmethane, 4,4'-diamino-3,3'-dihydroxydiphenylmethane, 4,4'-diamino-2,2'-dihydroxydiphenylmethane, 2,2-bis[4-amino-3-carboxyphenyl]propane, 2,2-bis[3-amino-4-carboxyphenyl]hexafluoropropane, and 4,4'-diamino-2,2',5,5'-tetracarboxydiphenylmethane; carboxydiphenyl ethers, such as 3,3'-diamino-4,4'-dicarboxydiphenyl ether, 4,4'-diamino-3,3'-dicarboxydiphenyl ether, 4,4'-diamino-2,2'-dicarboxydiphenyl ether, and 4,4'-diamino-2,2',5,5'-tetracarboxydiphenyl ether; diphenylsulfone compounds such as 3,3'-diamino-4,4'-dicarboxydiphenylsulfone, 4,4'-diamino-3,3'-dicarboxydiphenylsulfone, 4,4'-diamino-2,2'-dicarboxydiphenylsulfone, and 4,4'-diamino-2,2',5,5'-tetracarboxydiphenylsulfone; bis[(carboxyphenyl)phenyl]alkanes such as 2,2-bis[4-(4-amino-3-carboxyphenoxy) phenyl]propane; bis(hydroxyphenoxy)biphenyl compounds, such as 4,4'-bis(4-amino-3-hydroxyphenoxy) biphenyl; and bis[(carboxyphenoxy)phenyl]sulfones such as 2,2-bis[4-(4-amino-3-carboxyphenoxy)phenyl]sulfone. These hydroxy diamines may be used alone or in any combination at a desired ratio.

Of the above-described compounds, 3,3'-dihydroxy-4,4'-diaminobiphenyl represented by the following structural formula is preferable as the hydroxy diamine:

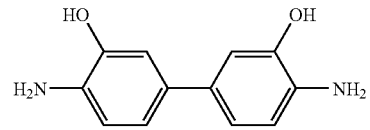

With the monomeric diamine component (A-2) containing 3,3'-dihydroxy-4,4'-diaminobiphenyl, the resulting thermosetting resin composition and cured resin can exhibit good soldering heat resistance and PCT resistance.

As is described above, the monomeric diamine component (A-2) preferably contains at least one diamine (in particular, meta-position diamine) represented by formula (2) and at least one hydroxy diamine described above. Even when no diamine represented by formula (2) is contained, at least one hydroxy diamine described above is preferably contained. In other words, in the present invention, the monomeric diamine component (A-2) preferably contains at least one type of diamine represented by formula (2) and/or hydroxy diamine. In this manner, the resulting thermosetting resin composition and cured resin can exhibit superior soldering heat resistance and PCT resistance.

The content of the diamine represented by formula (2) in the monomeric diamine component (A-2), i.e., the content of the diamine represented by formula (2) relative to the total of the diamines, is preferably 60 to 99 mol % per 100 mol % of all diamines.

The content of the hydroxy diamine in the monomeric diamine component (A-2), i.e., the ratio of the hydroxy diamine to all diamines, is preferably 1 to 40 mol % per 100 mol % of all diamines. If the contents of these diamines are outside the above-described ranges, the thermosetting resin composition and cured resin tend to exhibit lower solubility in various solvents, soldering heat resistance, and PCT resistance.

The ratio between these diamines may be appropriately selected. When both the diamine represented by formula (2)

and the hydroxy diamine are used, their contents should be within the above-described ranges.

The monomeric diamine component (A-2) may contain a diamine other than those represented by formula (2) and the hydroxy diamine. For the purpose of explanation this diamine is referred to as "third diamine". The third diamine contained in the monomeric diamine component (A-2) is not particularly limited but is preferably an aromatic diamine.

Examples of the aromatic diamine include m-phenylenediamine, o-phenylenediamine, p-phenylenediamine, m-aminobenzylamine, p-aminobenzylamine, bis(3-aminophenyl)sulfide, (3-aminophenyl)(4-aminophenyl)sulfide, bis(4-aminophenyl)sulfide, bis(3-aminophenyl)sulfoxide, (3-aminophenyl) (4-aminophenyl)sulfoxide, bis(3-aminophenyl) sulfone, (3-aminophenyl)(4-aminophenyl)sulfone, bis(4-aminophenyl)sulfone, 3,4'-diaminobenzophenone, 4,4'-diaminobenzophenone, 3,3'-diaminodiphenylmethane, 3,4'-diaminodiphenylmethane, 4,4'-diaminodiphenylmethane, 4,4'-diaminodiphenyl ether, 3,3'-diaminodiphenyl ether, 3,4'-diaminodiphenyl ether, bis[4-(3-aminophenoxy) phenyl]sulfoxide, and bis[4-(aminophenoxy)phenyl]sulfoxide.

These third diamines may be used alone or in combination at a desired ratio. The content of the third diamine in the monomeric diamine component (A-2) is preferably less than 10 mol % per 100 mol % of all diamines.

<Imidization of Polyamic Acid>

The monomeric acid dianhydride component (A-1) and the monomeric diamine component (A-2) are mixed in a solvent and the mixture is stirred to prepare a polyamic acid solution, as described in the previous section, <Production (synthesis) of polyamic acid>. The polyamic acid in the polyamic acid solution is subjected to imidization to obtain a soluble polyimide resin. The techniques of imidization that may be employed here include (1) a thermal technique, (2) a chemical technique, and (3) a vacuum imidization technique. By these techniques, the polyamic acid undergoes ring-closure dehydration to produce a polyimide resin.

The thermal technique (1) described above is a technique of heating a polyamic acid solution to perform ring-closure dehydration. The specific steps thereof are not particularly limited. For example, the polyamic acid solution may be heated to allow imidization reaction while evaporating the solvent. According to this thermal technique, a solid polyimide resin can be obtained. The conditions for heating are not particularly limited. Preferably, heating is performed at 300° C. for about 5 to 20 minutes.

The chemical technique (2) is a technique of performing ring-closure dehydration of a polyamic acid using a dehydration agent. The specific steps thereof are not particularly limited. For example, the polyamic acid solution may be combined with stoichiometric amounts or more of a dehydration agent and a catalyst to conduct ring-closure dehydration and evaporation of the organic solvent. According to this chemical technique, a solid polyimide resin can be obtained.

Examples of the dehydration agent include aliphatic acid anhydrides, such as acetic anhydride; aromatic anhydrides such as benzoic anhydride; and carbodiimides such as N,N'-dicyclohexylcarbodiimide and N,N'-diisopropylcarbodiimide. Examples of the catalyst include aliphatic tertiary amines such as triethylamine; aromatic tertiary amines such as dimethylaniline; heterocyclic tertiary amines such as pyridine, α-picoline, β-picoline, γ-picoline, and isoquinoline.

The temperature of the ring-closure dehydration by the chemical technique (2) is preferably 100° C. or less, and the reaction time is preferably about 1 minute to 50 hours. The evaporation of the organic solvent is preferably conducted at a temperature 200° C. or lower for about 5 to 120 minutes.

The vacuum imidization technique (3) is a technique of imidizing the polyamic acid by heating under a reduced pressure. The specific steps of the technique are not particularly limited. The heating conditions should be adjusted in the range of 80° C. to 400° C. In order to efficiently conduct imidization and dehydration, a temperature of 100° C. or higher is preferred, and a temperature of 120° C. or higher is more preferred.

In the heating process, the maximum temperature is preferably equal to or lower than the thermal decomposition temperature of the polyimide resin. The temperature is usually set in the range of about 150° C. to 350° C., which is the completion temperature of imidization. The pressure is preferably low. In particular, the pressure is preferably in the range of 0.001 to 0.9 atm, more preferably 0.001 to 0.8 atm, and most preferably 0.001 to 0.7 atm.

According to the vacuum imidization technique (3) above, the water generated by the imidization can be smoothly discharged outside the system, and thus hydrolysis of polyamic acid can be suppressed. As a result, a polyimide resin having a high molecular weight can be obtained. Moreover, according to this technique, impurities, which have one open ring or two open rings, in the acid dianhydride, i.e., the raw material of the polyamic acid, can be cyclized. Thus, the molecular weight of the polyimide resin can be further increased.

The imidization techniques (1) to (3) above are examples concerning evaporation of the solvent. The imidization techniques are not limited to these, and the solvent need not be evaporated. In particular, for example, the polyimide resin solution prepared in the technique (1) or (2) may be added into a poor solvent to precipitate the polyimide resin. According to this method, unreacted monomers (acid dianhydride and diamine) contained in the polyimide resin solution are removed for purification. The precipitants are dried to obtain a high-quality solid polyimide resin.

The poor solvent used in this technique may be any solvent that is well miscible with the solvent of the polyimide resin solution and that does not easily dissolve the polyimide resin. Examples of such a poor solvent include acetone, methanol, ethanol, isopropanol, benzene, methyl cellosolve (registered mark), and methyl ethyl ketone. One or more types of poor solvents may be used at any desirable ratio.

(II-2) Amine Component (B)

The amine component (B) used in the present invention should contain at least one amine. When the amine component (B) is contained in the thermosetting resin composition of the present invention, the thermosetting resin composition exhibits good resin flowability, and the cured resin can exhibit good heat resistance. Moreover, when the amine component (B) is contained, the epoxy resin component (C) described below can be efficiently cured during curing of the thermosetting resin composition.

The amine component (B) used in the present invention is not particularly limited. Examples thereof include monoamines, such as aniline, benzylamine, and aminohexane; various diamines previously described as the monomeric diamine component (A-2) used in synthesizing the polyamic acid; polyamines such as diethylenetriamine, tetraethylenepentamine, and pentaethylenehexamine. Among these amines, aromatic diamines are particularly preferable as the amine component (B). Aromatic diamines having a molecular weight of 300 or more are more preferable, and aromatic diamines having a molecular weight of 300 to 600 are most preferable. In this manner, the cured resin can exhibit good heat resistance and dielectric characteristics.

When the aromatic diamine has a molecular weight of less than 300, the cured resin produced therefrom may exhibit undesirable dielectric characteristics due to increased polar groups in the structure. In particular, the dielectric constant and the dielectric tangent of the cured resin tend to be high. In contrast, when the molecular weight exceeds 600, the density of crosslinks in the cured resin is low, and the heat resistance may be decreased.

The aromatic diamine is not particularly limited. Examples thereof include bis[(aminophenoxy)phenyl]alkanes such as [4-(4-aminophenoxy)phenyl]methane, 1,1-bis[4-(3-aminophenoxy)phenyl]ethane, 1,1-bis[4-(4-aminophenoxy)phenyl]ethane, 1,2-bis[4-(3-aminophenoxy)phenyl]ethane, 1,2-bis[4-(4-aminophenoxy)phenyl]ethane, 2,2-bis[4-(3-aminophenoxy)phenyl]propane, 2,2-bis[4-(4-aminophenoxy)phenyl]propane, and 2,2-bis[4-(3-aminophenoxy)phenyl]butane; bis[(aminophenoxy)phenyl] fluoroalkanes such as 2,2-bis[3-(3-aminophenoxy)phenyl]-1,1,1,3,3,3-hexafluoropropane and 2,2-bis[4-(4-aminophenoxy)phenyl]-1,1,1,3,3,3-hexafluoropropane; bis (aminophenoxy)benzene compounds such as 4,4'-bis(4-aminophenoxy)biphenyl; bis(aminophenoxy)ketone compounds such as bis[4-(3-aminophenoxy)phenyl]ketone and bis[4-(4-aminophenoxy)phenyl]ketone; bis[(aminophenoxy)phenyl]sulfide compounds such as bis[4-(3-aminophenoxy)phenyl]sulfide and bis[4-(4-aminophenoxy)phenyl] sulfide; bis[(aminophenoxy)phenyl]sulfone compounds such as bis[4-(3-aminophenoxy)phenyl]sulfone and bis[4-(4-aminophenoxy)phenyl]sulfone; bis[(aminophenoxy)phenyl] ether compounds such as bis[4-(3-aminophenoxy)phenyl] ether and bis[4-(4-aminophenoxy)phenyl]ether; bis [(aminophenoxy)benzoyl]benzene compounds such as 1,4-bis[4-(3-aminophenoxy)benzoyl]benzene and 1,3-bis[4-(3-aminophenoxy)benzoyl]benzene; bis[(aminophenoxy) benzoyl]diphenyl ether compounds such as 4,4'-bis[3-(4-aminophenoxy)benzoyl]diphenyl ether and 4,4'-bis[3-(3-aminophenoxy)benzoyl]diphenyl ether; benzophenone compounds such as 4,4'-bis[4-(4-amino-α,α-dimethylbenzyl) phenoxy]benzophenone; (phenoxy)phenylsulfone compounds such as 4,4'-bis[4-(4-amino-α,α-dimethylbenzyl) phenoxy]diphenylsulfone and bis[4-{4-(4-aminophenoxy) phenoxy}phenyl]sulfone; and bis[(aminophenoxy)dimethylbenzyl]benzene compounds such as 1,4-bis[4-(4-aminophenoxy)-α,α-dimethylbenzyl]benzene and 1,3-bis[4-(4-aminophenoxy)-α,α-dimethylbenzyl]benzene. These diamines may be used alone or in combination at any desired ratio.

Among these, 2,2-bis[4-(3-aminophenoxy)phenyl]propane, 2,2-bis[4-(4-aminophenoxy)phenyl]propane, 2,2-bis [3-(3-aminophenoxy) phenyl]-1,1,1,3,3,3-hexafluoropropane, 2,2-bis[4-(4-aminophenoxy)phenyl]-1,1,1,3,3,3-hexafluoropropane, bis[4-(3-aminophenoxy)phenyl]sulfone, bis[4-(4-aminophenoxy) phenyl]sulfone, bis[4-(3-aminophenoxy)phenyl]ether, and bis[4-(4-aminophenoxy)phenyl]ether are particularly preferable.

These compounds are preferable not only due to the handleability, such as high solubility in solvents, and ready availability. They are preferred because the amine component (B) containing any of these compounds can impart good heat resistance (such as high glass transition temperature) and dielectric characteristics to the cured resin made therefrom.

(II-3) Epoxy Resin Component (C)

The epoxy resin component (C) used in the present invention should contain at least one epoxy resin. By incorporating the epoxy resin component (C), the thermosetting resin composition of the present invention can exhibit satisfactory resin flowability, and the cured resin made therefrom can exhibit good heat resistance and insulating property. Inclusion of the epoxy resin component (C) also imparts good adhesiveness to conductors, such as metal foils, and circuit boards.

The epoxy resin is not particularly limited. Examples of the epoxy resin include epoxy resins such as bisphenol-epoxy-type resins, bisphenol A-novolac-type epoxy resins, biphenyl-type epoxy resins, phenol-novolac-type epoxy resins, alkylphenol-novolac-type epoxy resins, polyglycol-type epoxy resins, alicyclic epoxy resins, cresol-novolac-type epoxy resins, glycidyl amine-type epoxy resins, naphthalene-type epoxy resins, urethane-modified epoxy resins, rubber-modified epoxy resins, and epoxy-modified polysiloxane; halogenated products of these epoxy resins; and crystalline epoxy resins having a melting point. These epoxy resins may be used alone or in combination at any desired ratio.

Of these epoxy resins, an epoxy resin having at least one aromatic ring and/or an aliphatic ring in the molecular chain, a biphenyl-type epoxy resin having a biphenyl skeleton, a naphthalene-type epoxy resin having a naphthalene skeleton, and a crystalline epoxy resin having a melting point are particularly preferable. These epoxy resins are readily available and have high compatibility with the components (A), (B), and (D). The epoxy resin can impart good resin flowability to the resulting thermosetting resin composition and good heat resistance and insulating property to the cured resin prepared therefrom.

Of the epoxy resins described above, epoxy resins represented by the formulae in group (3) below and crystalline epoxy resins are particularly preferable:

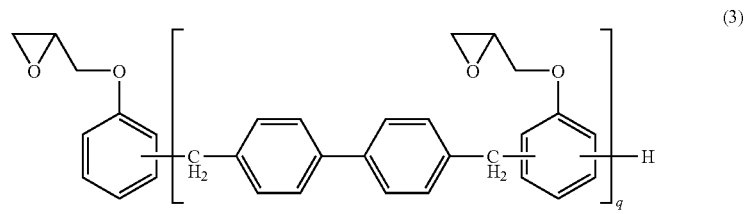

(3)

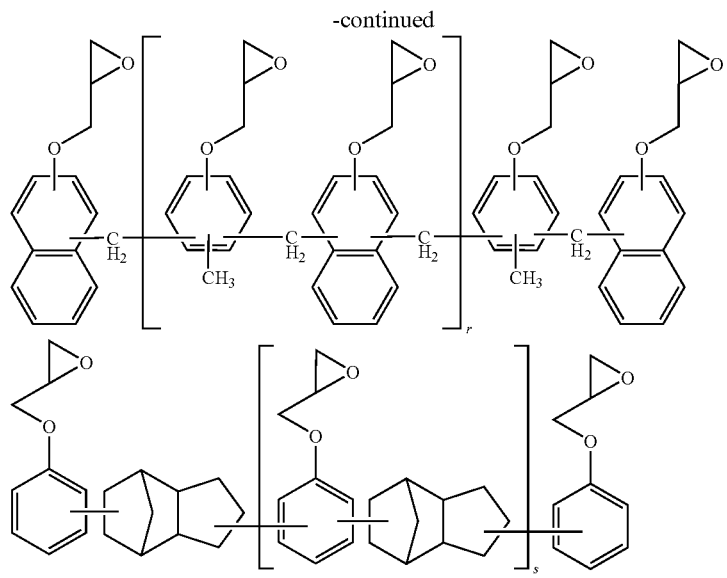

(wherein q, r, and s each independently represent an integer). These epoxy resins can impart desired characteristics, such as dielectric characteristics, heat resistance, and circuit embedding property, to the thermosetting resin composition and the cured resin. Moreover, a good balance among these characteristics can be achieved.

A crystalline epoxy resin is most preferable. The crystalline epoxy resin specifically decreases the melt viscosity of the thermosetting resin composition. Thus, the circuit embedding property can be significantly improved, i.e., the resin flowability can be notably improved.

The crystalline epoxy resins are not particularly limited as long as they have melting points. In particular, a biphenyl epoxy resin YX4000H manufactured by Japan Epoxy Resins Co., Ltd., or a xanthene epoxy resin EXA7337 produced by Dainippon Ink and Chemicals, Inc. is preferably used as the crystalline epoxy resin.

The lower limit of the melting point of the crystalline epoxy resin is preferably 60° C. or more and more preferably 80° C. or more. The upper limit of the melting point is preferably 220° C. or less and more preferably 200° C. or less. Thus, the melting point of the crystalline epoxy resin is preferably in the range of 60° C. to 220° C. A resin having a melting point less than 60° C. tends to cause phase separation during forming of the thermosetting resin composition into a sheet. Thus, the epoxy resin component (C) may be precipitated on the sheet surface, or the sheet may become sticky. When the melting point exceeds 220° C., higher temperature will be needed to bond the thermosetting resin composition to circuit boards.

The epoxy resin used as the epoxy resin component (C) may be any one described above but preferably has high purity. With such an epoxy resin, the thermosetting resin composition and the cured resin can exhibit highly reliable electrical insulating property. In the present invention, the purity is indicated in terms of concentration of halogen or alkali metal in the epoxy resin. In detail, the concentration of the halogen or alkali metal in the epoxy resin is preferably 25 ppm or less and more preferably 15 ppm or less when the resin is extracted at 120° C. at 2 atm. At a halogen or alkali metal content exceeding 25 ppm, the cured resin does not exhibit reliable electrical insulating property.

The epoxy resin used as the epoxy resin component (C) may be any of the above-described epoxy resins. Preferably the lower limit of the epoxy number (epoxy equivalents) of the epoxy resin is 150 or more, more preferably 170 or more, and most preferably 190 or more. The upper limit of the epoxy number of the epoxy resin is 700 or less, more preferably 500 or less, and most preferably 300 or less. That is, the epoxy number of the epoxy resin used as the epoxy resin component (C) is preferably in the range of 150 to 700.

When the epoxy resin has an epoxy number of less than 150, the dielectric characteristics may be impaired, i.e., the dielectric constant and the dielectric tangent tend to be high. At an epoxy number exceeding 700, the heat resistance may be impaired.

(II-4) Imidazole Component (D)

The imidazole component (D) used in the present invention should contain at least one imidazole. By incorporating the imidazole component (D) in the thermosetting resin composition of the present invention, the curing reaction between the amine component (B) and the epoxy resin component (C) can be accelerated.

The present inventors have found based on extensive studies that when the imidazole component (D) is used in combination with the components (A) to (C) above, the minimum melt viscosity of the resulting thermosetting resin composition can be decreased further and the circuit embedding property can be notably enhanced (i.e., increased resin flowability). The reason for this is not clear. Thus, according to the present invention, the thermosetting resin composition (uncured) and the cured resin can exhibit good dielectric characteristics, flowability, heat resistance, adhesiveness, and processability and achieve a good balance among these characteristics.

The content (the mixing ratio) of the imidazole component (D) in the thermosetting resin composition of the present invention is not particularly limited. A preferable range of the imidazole component (D) content can be indicated in terms of mass ratio (weight ratio) to the epoxy resin component (C). In particular, the total of the imidazole component (D) should be at least 0.05 part by mass, more preferably at least 0.1 part by mass, and most preferably at least 0.5 part by mass per 100 parts by mass of the entire epoxy resin component (C). The upper limit of the imidazole component (D) content is preferably 10.0 parts by mass or less, more preferably 5.0 parts by mass or less, and most preferably 3.0 parts by mass or less. In other words, the imidazole component (D) content is preferably in the range of 0.05 to 10.0 parts by mass per 100 parts by mass of the epoxy resin component (C).

At an imidazole component (D) content of less than 0.05 part by mass, the circuit embedding property may not be sufficiently improved and the curing reaction between the amine component (B) and the epoxy resin component (C) may not be satisfactorily accelerated. In contrast, at a imidazole component (D) content exceeding 10.0 parts by mass, the curing reaction between the amine component (B) and the epoxy resin component (C) is excessively accelerated, thereby degrading the storage stability and handleability of the thermosetting resin composition.

The imidazole used as the imidazole component (D) is not particularly limited. Examples of the imidazole include imidazoles such as imidazole, imidazole, 2-ethylimidazole, 2-ethyl-4-methylimidazole, 2-phenylimidazole, 2-undecylimidazole, 1-benzyl-2-methylimidazole, 2-heptadecylimidazole, 2-isopropylimidazole, 2,4-dimethylimidazole, and 2-phenyl-4-methylimidazole; imidazolines such as 2-methylimidazoline, 2-ethylimidazoline, 2-isopropylimidazoline, 2-phenylimidazoline, 2-undecylimidazoline, 2,4-dimethylimidazoline, and 2-phenyl-4-methylimidazoline; azine imidazoles such as 2,4-diamino-6-[2'-methylimidazolyl-(1')]-ethyl-s-triazine, 2,4-diamino-6-[2'-undecylimidazolyl-(1')]-ethyl-s-triazine, and 2,4-diamino-6-[2'-ethyl-4'-methylimidazolyl-(1')]-ethyl-s-triazine. These imidazoles may be used alone or in combination at any desired ratio.

Among these compounds, 2-ethyl-4-methylimidazole, 2-phenyl-4-methylimidazole, and 2,4-diamino-6-[2'-undecylimidazolyl-(1')]-ethyl-s-triazine are particularly preferable since they have excellent circuit embedding property, ready availability, and high solubility in solvents.

(II-5) Additional Component (E)

The thermosetting resin composition of the present invention may include an additional component (E) in addition to the components (A) to (D) above. The additional component (E) is not particularly limited. Examples of the additional component (E) include the following: (E-1) a curing agent, other than the amine component (B), for the epoxy resin component (C); (E-2) a curing accelerator, other than the imidazole component (D), for accelerating the reaction between the epoxy resin component (C) and the curing agent; and (E-3) a thermosetting component.

<Curing Agent (E-1)>

The curing agent (E-1) is not particularly limited. Examples of thereof include phenolic resins such as phenol-novolac-type phenolic resins, cresol-novolac-type phenolic resins, naphthalene-type phenolic resins; aliphatic acid anhydrides, such as dodecyl succinic anhydride, poly(adipic anhydride), and poly(azelaic anhydride); alicyclic acid anhydrides, such as hexahydrophthalic anhydride and methylhexahydrophthalic anhydride; aromatic acid anhydrides such as phthalic anhydride, trimellitic anhydride, benzophenonetetracarboxylic acid, ethylene glycol bistrimellitate, and glycerol tristrimellitate; other resins such as amino resins, urea resins, and melamine resins; dicyandiamide; dihydrazine compounds; salts of Lewis acid and bronsted acid; polymercaptan compounds; and isocyanate and block isocyanate compounds. These curing agents may be used alone or in any combination at a desired ratio.

The amount of the curing agent used (the mixing ratio) is not particularly limited. The amount should be sufficient to allow curing of the epoxy resin component (C) without impairing the dielectric characteristics of the cured resin. Typically, the content of the curing agent is 1 to 100 parts by weight per 100 parts by weight of the entire epoxy resin component (C).

<Curing Accelerator (E-2)>

The curing accelerator (E-2) is not particularly limited. Examples thereof include phosphinic compounds such as triphenylphosphine; amine compounds such as tertiary amines, trimethanolamine, triethanolamine, and tetraethanolamine; and borate compounds such as 1,8-diazabicyclo[5,4,0]-7-undecenium tetraphenylborate. These curing accelerators may be used alone or in combination at any desired ratio.

The amount of the curing accelerator used (the mixing ratio) is not particularly limited. The amount should be sufficient to accelerate the reaction between the epoxy resin component and the curing agent without impairing the dielectric characteristics of the cured resin. Typically, the content of the curing accelerator is 0.01 to 10 parts by weight per 100 parts by weight of the entire epoxy resin component (C).

<Thermosetting Component (E-3)>

The thermosetting component (E-3) described above is not particularly limited. Examples thereof include thermosetting resins such as bismaleimide resins, bisallylnadimide resins, acrylic resins, methacrylic resins, hydrosilyl resins, allyl resins, and unsaturated polyester resins; and thermosetting polymers having reactive groups, such as an allyl group, a vinyl group, an alkoxysilyl group, and a hydrosilyl group, in side chains or at termini of the molecular chain. These thermosetting components may be used alone or in combination at any desired ratio. By adding the thermosetting component, the thermosetting resin composition and the cured resin can exhibit improved properties, such as adhesiveness, heat resistance, and processability.

The amount of the thermosetting component used (mixing ratio) is not particularly limited. The amount should be sufficient to improve various characteristics without degrading the dielectric characteristics of the cured resin.

(III) Use of Thermosetting Resin Composition of the Present Invention

The thermosetting resin composition of the present invention can be applied to various usages. The thermosetting resin composition is suitable as the material for making circuit boards such as flexible printed circuits and build-up circuit boards. To be more specific, the thermosetting resin composition is suitable as a protective material for protecting circuit boards and circuit patterns formed on the circuit boards and as an interlayer insulating material for ensuring insulation between layers of multilayer circuit boards.

<Resin Solution>

The form of the thermosetting resin composition is not particularly limited. For example, the thermosetting resin composition may be used as a resin solution (varnish). The method for preparing the resin solution is not particularly limited. For example, the thermosetting resin composition of the present invention may be added to an adequate solvent, followed by stirring. Alternatively, the components (A) to (E) above may be separately dissolved in suitable solvents to prepare solutions of individual components, and then these solutions are combined. Here, the solution may contain only one of the components (A) to (E) above or two or more of these components. When two or more compounds are used for one component, separate solutions may be prepared for the respective compounds. For examples, when two polyimide resins are used as the polyimide resin component (A), separate solutions of these polyimide resins may be prepared and then combined.

The solvents that can be used to form the resin solutions are not particularly limited and may be any solvents that can dissolve the thermosetting resin composition or the components (A) to (E). Preferably, the solvents have a boiling point of 150° C. or less. Examples of the solvents include ethers, e.g., cyclic ethers such as tetrahydrofuran, dioxolane, and dioxane; and linear ethers such as ethylene glycol dimethyl ether, triglyme, diethylene glycol, ethyl cellosolve, and methyl cellosolve. It is also preferable to use mixed solvents combining these ethers with toluene, xylenes, glycols, N,N-dimethylformamide, N,N-dimethylacetamide, N-methylpyrrolidone, cyclic siloxane, linear siloxane, or the like. These solvents may be used alone or in combination at any desired ratio.

<Resin Sheet>

The thermosetting resin composition of the present invention may be formed into a sheet and then be used as a resin sheet. The form of the resin sheet is not particularly limited. For example, the resin sheet may be a one-layer sheet composed of only the thermosetting resin composition, or a laminate such as a two-layer sheet including a base film and a resin layer composed of the thermosetting resin composition disposed on one of the film surfaces, a three-layer sheet including a base film and resin layers composed of the thermosetting resin composition on both film surfaces, or a multilayer sheet prepared by alternately stacking base films and resin layers composed of the thermosetting resin composition. The present invention thus includes not only the thermosetting resin composition but also a laminate including at least one resin layer composed of the thermosetting resin composition.

The technique of forming the resin sheet is not particularly limited. Typically, the resin solution described above is flow-cast or applied on a film base (support) and then dried to form a film. In the resulting resin sheet, the thermosetting resin composition is in a semi-cured state (B-stage). Thus, by separating the semicured resin sheet from the support, a one-layer sheet can be prepared. Alternatively, the resin sheet may be left on the support so that a two-layer sheet constituted from a film base and a resin layer composed of the thermosetting resin composition can be obtained.

The resin solution may be flow-cast or applied on both surfaces of the film base and then dried to form a three-layer sheet constituted from a film base and two resin layers disposed on the both surfaces of the film base.

The multilayer sheet described above may be prepared by repeating the step of flow-casting or applying the resin solution on a surface of the film base and then drying the resin solution.

The type of the film base usable as the support is not particularly limited. Any known resin film may be adequately used. In making a one-layer sheet, a support other than the film base may be used. Examples of such a support include a drum and an endless belt.

The thickness of a resin layer composed of the thermosetting resin composition constituting a resin sheet is not particularly limited regardless of whether the resin sheet is a one-layer sheet or a multilayer sheet. The thickness of the resin layer may be appropriately adjusted according to the usage.

The resin solution (varnish) of the thermosetting resin composition of the present invention may be used to impregnate various fibers, such as glass cloth, glass mat, aromatic polyamide textile fabric, and aromatic polyamide fiber mat. By semi-curing the thermosetting resin composition impregnating the fibers, a fiber-reinforced resin sheet can be prepared.

<Metal Layer-Containing Laminate>

A laminate containing a metal layer can be produced by using a base film composed of metal, such as copper or aluminum, instead of a resin film. The structure of the metal layer-containing laminate is not particularly limited and may be any laminate constituted from at least one resin layer composed of the thermosetting resin composition and at least one metal layer. A resin layer may be disposed on one or each of surfaces of the metal layer. Alternatively, metal layers and resin layers may be alternately stacked.

The metal layer-containing laminate may be prepared by flow-casting or applying a resin solution on a surface of a metal layer and by drying the resin, as described above, but the method of preparing the laminate is not limited to this. For example, a laminate may be prepared by bonding a metal foil on a resin surface of the one-layer sheet or two-layer sheet prepared by the above-described process. Alternatively, a laminate may be prepared by forming a metal layer on a resin surface of a one-layer or two-layer sheet by chemical plating, sputtering, or the like.

<Circuit Board>

The metal layer-containing laminate can be formed into a circuit having a desired pattern (patterned circuit) by etching the metal layer when the metal layer is composed of a metal usable as a conductor for the circuit board. In other words, a circuit board can be prepared by forming a patterned circuit in the metal layer of the metal layer-containing laminate of the present invention. Thus, the present invention includes a circuit board made using the thermosetting resin composition.

The technique of etching is not particularly limited. Any known metal etching technique that uses, for example, a dry film resist or a liquid resist may be adequately employed. If the resin layer, i.e., the support, retains flexibility even after curing, the board can be used as a flexible printed circuit board. To protect the patterned circuit formed by etching, the above-described semi-cured resin sheet (the thermosetting resin composition in the form of sheet) may be disposed on the patterned circuit. By stacking resin layers having patterned circuits, i.e., a metal layer-containing laminate having a two-layer structure, a multilayer build-up circuit board can be made.

The semi-cured resin layer has an adequate degree of flowability. Thus, by conducting thermal press bonding, such as thermal press treatment, lamination (thermal lamination), or hot roll lamination, the gaps between lines of the patterned circuit can be adequately filled with the resin (the thermosetting resin composition).

The process temperature of the thermal press bonding is not particularly limited but is preferably in the range of 50° C. to 200° C., more preferably 60° C. to 180° C., and most preferably 80° C. to 130° C. At a process temperature exceeding 200° C., the resin layer may be completely cured by thermal press bonding. At a process temperature less than 50° C., the flowability of the resin layer is low, and it is difficult to fill the patterned circuit with the resin.

The resin layer on the patterned circuit serves as a protective material for protecting the patterned circuit or as an interlayer insulating material in a multilayer circuit board. Thus, after the patterned circuit is embedded in the resin, the resin layer is preferably completely cured by exposure, thermal curing, or the like. The technique of exposure or thermal curing is not particularly limited as long as conditions that can sufficiently cure the resin layer, i.e., the thermosetting resin composition, are selected.

In order to cure the resin layer (the thermosetting resin composition), post-heating is preferably performed after bonding of the metal layer to the resin layer to allow curing reaction of the epoxy resin component (C) to progress sufficiently. The conditions of the post-heating are not particularly limited. Preferably, the post-heating is performed at 150° C. to 200° C. for 10 minutes to 3 hours.

As has been described above, the laminate and the circuit board of the present invention include a resin layer composed of the thermosetting resin composition. The resin layer can impart various desirable characteristics, such as adhesiveness, processability, handleability, heat resistance, resin flowability, and dielectric characteristics, to the laminate and the circuit board while achieving a good balance among these characteristics. As a result, a high-quality laminate or circuit board can be advantageously manufactured. In particular, when a laminate or a circuit board has a circuit or the like, the electrical reliability of the circuit can be ensured, and a decrease in signal transmission rate and loss of signals in the circuit can be suppressed.

EXAMPLES

The present invention will now be described in further detail by way of Examples. Note that the scope of the present invention is not limited to these examples. Persons skilled in the art may apply various changes, modifications, and alternations without departing from the spirit of the present invention. Note that when the thermosetting resin composition is used in the form of a resin sheet, the flowability, the laminatability, and volatile component content were evaluated or determined as below. The dielectric characteristics and the glass transition temperature of a cured resin sheet (cured resin) prepared by thermally curing the resin sheet were evaluated or determined as below.

[Flowability]

Using a shear-mode dynamic viscoelasticity meter (CVO produced by Bohlin Instruments Ltd.), the complex viscosity (Pa·s) of the resin sheet before thermal curing was measured under conditions described below and converted in terms of melt viscosity (poise). The evaluation of the melt viscosity of each resin sheet was conducted for the smallest melt viscosity in the temperature range of 60° C. to 200° C.

Measurement frequency: 1 Hz

Heating rate: 12° C./min

Test specimen: A circular resin sheet 3 mm in diameter

[Laminatability]

A resin sheet (50 μm in thickness) was interposed between a glossy surface of a copper foil (series number BHY22BT, produced by Japan Energy Corporation) and a circuit-carrying surface of a glass epoxy substrate FR-4 (series number: MCL-E-67 produced by Hitachi Chemical Co., Ltd.; thickness of copper foil: 50 μm, the total thickness: 1.2 mm) including a circuit having a height of 18 μm, a circuit line width of 50 μm, and a line spacing of 50 μm so as to make direct contact with these surfaces. Thermal pressing was conducted at 180° C. under a pressure of 3 MPa for 1 hour to prepare a laminate. The copper foil of the laminate was chemically removed with an iron(III) chloride-hydrochloric acid solution. The exposed surface of the resin sheet was observed with an optical microscope (×50 magnification) to confirm whether bubbles are present between the circuit lines.

The laminatability was evaluated as "pass (P)" when no bubbles were observed between circuit lines, i.e., when the space between circuit lines was completely filled with the resin. The laminatability was evaluated as "fail (F)" when bubbles were observed between the circuit lines.

[Calculation of Volatile Component Content in Resin Sheet]

Using a mass analyzer (serial number: TGA 50 produced by Shimadzu Corporation), a resin sheet is placed in a sample container, and changes in weight were observed under the following conditions:

Measurement temperature range: 15° C. to 350° C.

Heating rate: 20° C./min

Measurement atmosphere: Nitrogen, flow: 50 mL/min

Sample container: composed of aluminum

The volatile component content was determined as the ratio of the decrease in weight in the temperature range of 100° C. to 300° C. to the weight of the resin sheet before the change in weight.

[Dielectric Characteristics]

Using a cavity resonator for dielectric constant measurement by perturbation method (produced by Kanto Electronics Application and Development Inc.), the dielectric constant and dielectric tangent of the cured resin sheet were measured under the following conditions:

Measurement frequency: 3 GHz, 5 GHz, and 10 GHz

Measurement temperature: 22° C. to 24° C.

Measurement humidity: 45% to 55%

Test piece: a resin sheet left to stand for 24 hours at the above-described measurement temperature and humidity

[Glass Transition Temperature]

Using an analyzer DMS-200 (serial number, produced by Seiko Instruments & Electronics Ltd.), the storage modulus ($\in'$) of a cured resin sheet was measured at a measurement length (fixture gap) of 20 mm under the conditions described below, and the inflection point of the storage modulus ($\in'$) was defined as the glass transition temperature (° C.):

Measurement atmosphere: dry air atmosphere

Measurement temperature: 20° C. to 400° C.

Test piece: a strip of the cured resin sheet having a width of 9 mm and a length of 40 mm

[Synthetic Examples of Polyimide Resin]

Into a 2,000 mL glass flask charged with dimethylformamide (DMF), 0.95 equivalent of 1,3-bis(3-aminophenoxy)benzene (APB) and 0.05 equivalent of 3,3'-dihydroxy-4,4'-diaminobiphenyl (produced by Wakayama Seika Kogyo Co., Ltd.) were fed and dissolved under a nitrogen atmosphere by stirring to prepare a DMF solution. After the flask was purged with nitrogen, the DMF solution was cooled in an ice bath while stirring, and 1 equivalent of 4,4'-(4,4'-isopropylidenediphenoxy)bisphthalic anhydride (IPBP produced by GE corporation) was added thereto. The resulting mixture was stirred further for three hours to obtain a polyamic acid solution. The amount of the DMF was adjusted so that the concentration of the monomers, i.e., APG, 3,3'-dihydroxy-4,4'-diaminobiphenyl, and IPBP was 30 percent by weight.

Next, 300 g of the polyamic acid solution was placed in a vat coated with a fluorocarbon resin and vacuum-heated at 200° C. at a pressure of 5 mmHg (about 0.007 atm and about 5.65 hPa) in a vacuum oven for three hours to obtain a polyimide resin.

Example 1

The components below were dissolved in dioxolane according to the mixing ratio shown in Table 1 to prepare a resin solution (varnish) as the thermosetting resin composition of the present invention:

(A) polyimide resin component: the polyimide resin prepared by the synthetic example described above;

(B) amine component: bis[4-(4-aminophenoxy)phenyl]sulfone (BAPS, molecular weight=432 g/eq produced by Wakayama Seika Kogyo Co., Ltd.);

(C) epoxy resin component: crystalline biphenyl-type epoxy resin (trade name: YX4000H manufactured by Japan Epoxy Resins Co., Ltd., melting point: about 106° C.; epoxy number=194 g/eq); and (D) imidazole component: 2,4-diamino-6-[2'-undecylimidazolyl-(1')]-ethyl-s-triazine (trade name: Curezol C11Z-A produced by Shikoku Chemicals Co., Ltd.).

The resulting resin solution was flow-cast on a surface of a PET film (trade name; Cellapeel HP, produced by Toyo Metallizing Co., Ltd.) serving as a support and having a thickness of 125 μm. The cast resin was heat-dried in a hot-air oven at 60° C., 80° C., 100° C., 120° C., and 140° C. for three minutes each to prepare a two-layer sheet having a PET film as the film base. From this two-layer sheet, the PET film was separated to obtain a one-layer sheet (a resin sheet before thermal curing). The thickness of the resin sheet was 50 μm. The resin flowability, laminatability, and volatile component content of the resin sheet were evaluated. The results are shown in Table 3.

The resin sheet was then interposed between the rolled copper foils (trade name: BHY-22B-T, produced by Japan Energy Corporation) having a thickness of 18 μm so that the resin sheet comes into contact with roughened surfaces of the rolled copper foils. The resin sheet and the foils were heat-pressed for 1 hour at 180° C. and a pressure of 3 MPa to prepare a copper foil laminate (metal layer-containing laminate) constituted from rolled copper foils and a resin sheet interposed therebetween. The copper foils were removed from the copper foil laminate by etching to obtain a cured resin sheet. The dielectric characteristics and the glass transition temperature of the cured resin sheet were measured. The results are shown in Table 4.

Examples 2 to 7

A resin sheet (before thermal curing) and a cured resin sheet prepared by curing this resin sheet were prepared as in EXAMPLE 1 except that the components (A) to (D) were compounded at a mixing ratio shown in Table 1.

In Table 1, YX4000H (trade name, produced by Japan Epoxy Resins Co., Ltd.) is a biphenyl-type epoxy resin, and NC7000L (trade name, produced by Nippon Kayaku Co., Ltd.) is a naphthalene-type epoxy resin. BAPS (produced by Wakayama Seika Kogyo Co., Ltd.) is bis[4-(4-aminophenoxy)phenyl]sulfone and HFBAPP (produced by Wakayama Seika Kogyo Co., Ltd.) is 2,2-bis[4-(4-aminophenoxy)phenyl]-1,1,1,3,3,3-hexafluoropropane. C11Z-A (trade name, produced by Shikoku Corporation) is 2,4-diamino-6-[2'-undecylimidazolyl-(1')]-ethyl-s-triazine.

The flowability, laminatability, and volatile component content of the resulting resin sheet were evaluated. The dielectric characteristics and the glass transition temperature of the cured resin were evaluated. The results are shown in Tables 3 and 4.

TABLE 1

| | EXAMPLE | | | | | | |
|---|---|---|---|---|---|---|---|
| | 1 | 2 | 3 | 4 | 5 | 6 | 7 |
| Polyimide resin component (A) | Polyimide resin of synthetic example | | | | | | |
| Amount used (g) | 65 | 35 | 50 | 50 | 50 | 70 | 20 |
| Diamine component (B) (Molecular weight) | | BAPS (432) | | HFBAPP (518) | | BAPS (432) | |
| Amount used (g) | 12.6 | 23.3 | 9.5 | 25.0 | 5.0 | 10.8 | 28.8 |
| No. of moles of active hydrogen groups | 0.12 | 0.22 | 0.09 | 0.19 | 0.046 | 0.10 | 0.27 |
| Epoxy resin component (C) (Epoxy number) | | YX4000H (194) | | YX4000H (194) NC7000L (228) | | YX4000H (194) | |
| Amount used (g) | 22.4 | 41.7 | 40.5 | 12.5 12.5 | 45.0 | 19.2 | 51.2 |
| No. of moles of epoxy groups (mol) | 0.12 | 0.21 | 0.21 | 0.06 0.05 | 0.23 | 0.10 | 0.26 |
| Imidazole component (D) | | | | C11Z-A | | | |
| Amount used (g) | 0.11 | 0.21 | 0.20 | 0.13 | 0.23 | 0.10 | 0.26 |
| Mixing ratio | | | | | | | |
| (A)/[(B) + (C)] (Mass ratio) | 1.85 | 0.43 | 1.0 | 1.0 | 1.0 | 2.33 | 0.25 |
| (B)/(C) (Molar ratio) | 1.0 | 1.0 | 0.4 | 1.7 | 0.2 | 1.0 | 1.0 |

COMPARATIVE EXAMPLES 1 TO 3

In each COMPARATIVE EXAMPLE, a resin sheet (before thermal curing) and a cured resin sheet prepared by curing this resin sheet were prepared as in EXAMPLE 1 except that the components (A) to (D) are mixed at a ratio shown in Table 2.

The flowability, laminatability, and volatile component content of the resulting resin sheet were evaluated. The dielectric characteristics and glass transition temperature of the cured resin sheet were evaluated. The results are shown in Tables 3 and 4.

TABLE 2

| | COMPARATIVE EXAMPLE | | |
|---|---|---|---|
| | 1 | 2 | 3 |
| Polyimide resin component (A) | Polyimide resin of synthetic example | | |
| Amount used (g) | 65 | 70 | 20 |
| Diamine component (B) (Molecular weight) | | BAPS (432) | |
| Amount used (g) | 12.6 | 10.8 | 28.8 |
| No. of moles of active hydrogen groups | 0.12 | 0.10 | 0.27 |

TABLE 2-continued

|  | COMPARATIVE EXAMPLE | | |
|---|---|---|---|
|  | 1 | 2 | 3 |
| Epoxy resin component (C) (Epoxy number) | | YX4000H (194) | |
| Amount used (g) | 22.4 | 19.2 | 51.2 |
| No. of moles of epoxy groups (mol) | 0.12 | 0.10 | 0.26 |
| Imidazole component (D) Amount used (g) | — | — | — |
| Mixing ratio | | | |
| (A)/[(B) + (C)] (Mass ratio) | 1.85 | 2.33 | 0.25 |
| (B)/(C) (Molar ratio) | 1.0 | 1.0 | 1.0 |

TABLE 3

|  |  | Melt viscosity [Poise] | Laminatability | Volatile component content [wt %] |
|---|---|---|---|---|
| EXAMPLE | 1 | 655 | P | 3.5 |
|  | 2 | 340 | P | 2.1 |
|  | 3 | 1100 | P | 3.2 |
|  | 4 | 17000 | P | 3.8 |
|  | 5 | 800 | P | 3.2 |
|  | 6 | 1130000 | F | 4.2 |
|  | 7 | 20 | F | 1.6 |
| COMPARATIVE EXAMPLE | 1 | 96500 | F | 3.0 |
|  | 2 | 2440000 | F | 4.8 |
|  | 3 | 63000 | F | 1.8 |

TABLE 4

|  |  | Glass transition temperature (° C.) | Dielectric characteristics (dielectric constant/dielectric tangent) | | |
|---|---|---|---|---|---|
|  |  |  | Frequency: 1 GHz | Frequency: 5 GHz | Frequency: 10 GHz |
| EXAMPLE | 1 | 170 | 3.0/0.014 | 2.9/0.014 | 2.8/0.014 |
|  | 2 | 179 | 3.1/0.017 | 3.0/0.018 | 3.0/0.018 |
|  | 3 | 178 | 3.0/0.016 | 3.0/0.017 | 2.9/0.017 |
|  | 4 | 172 | 2.5/0.013 | 2.5/0.014 | 2.4/0.014 |
|  | 5 | 160 | 3.1/0.016 | 3.1/0.017 | 3.0/0.018 |
|  | 6 | 165 | 3.0/0.014 | 2.9/0.014 | 2.8/0.014 |
|  | 7 | 171 | 3.2/0.018 | 3.1/0.019 | 3.0/0.019 |
| COMPARATIVE EXAMPLE | 1 | 168 | 3.0/0.014 | 2.9/0.014 | 2.8/0.015 |
|  | 2 | 163 | 3.1/0.014 | 3.0/0.015 | 3.0/0.015 |
|  | 3 | 167 | 3.4/0.021 | 3.4/0.021 | 3.2/0.022 |

The results shown above clearly indicate that the thermosetting resin compositions of the present invention containing the polyimide resin component (A), the amine component (B), the epoxy resin component (C), and the imidazole component (D) exhibit sufficient adhesiveness (i), processability and handleability (ii), heat resistance (iii), resin flowability (iv), and dielectric characteristics (v) and achieve a good balance among these characteristics.

It should be understood that the present invention is not limited to the above-described embodiments and examples. Various modification and alternation are possible within the range of the invention set forth in the claims below. Any combination of the above-described embodiments and examples is also included in the range of the present invention.

What is claimed is:

1. A thermosetting resin composition comprising:
a polyimide resin component (A) containing at least one polyimide resin;
an amine component (B) containing at least one amine;
an epoxy resin component (C) containing at least one epoxy resin; and
an imidazole component (D) containing at least one imidazole, and
wherein the thermosetting resin composition is in a semi-cured state and has a minimum melt viscosity in the range of 100 poise to 50,000 poise in the temperature range of 60° C. to 200° C.

2. The thermosetting resin composition according to claim 1, wherein the mass ratio of the content of the polyimide resin component (A) to the total content of the amine component (B) and the epoxy resin component (C) is in the range of 0.4 to 2.0.

3. The thermosetting resin composition according to claim 2, wherein the epoxy resin component (C) contains a crystalline epoxy resin.

4. The thermosetting resin composition according to claim 3, wherein the melting point of the crystalline epoxy resin is in the range of 60° C. to 220° C.

5. The thermosetting resin composition according to claim 1, wherein the ratio of the number of moles of active hydrogen contained in the amine component (B) to the number of moles of epoxy groups in the epoxy resin contained in the epoxy resin component (C) is in the range of 0.4 to 2.0.

6. The thermosetting resin composition according to claim 1, wherein the amine component (B) contains an aromatic diamine having a molecular weight of 300 or more.

7. The thermosetting resin composition according to claim 1, wherein the at least one polyimide resin contained in the polyimide resin component (A) is prepared by reacting a diamine component (A-2) containing at least one diamine and an acid dianhydride (A-1) containing at least one acid dianhydride having a structure represented by formula (1):

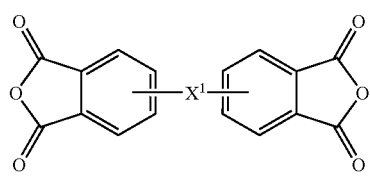

(1)

(wherein $X^1$ represents a divalent group selected from the group consisting of —O—, —CO—, —O—$X^2$—O—, and —COO—$X^2$—OCO—, wherein $X^2$ represents a divalent organic group).

8. A laminate comprising at least one resin layer including the thermosetting resin composition according to claim 1.

9. A circuit board comprising the thermosetting resin composition according to claim 1.

* * * * *